US005600788A

United States Patent [19]
Lofgren et al.

[11] Patent Number: 5,600,788
[45] Date of Patent: Feb. 4, 1997

[54] DIGITAL TEST AND MAINTENANCE ARCHITECTURE

[75] Inventors: John D. Lofgren; James A. Thorne, both of Orlando, Fla.

[73] Assignee: Martin Marietta Corporation, Bethesda, Md.

[21] Appl. No.: 182,835

[22] Filed: Jan. 19, 1994

[51] Int. Cl.⁶ .................................................. G06F 11/26
[52] U.S. Cl. ............................................... 395/183.07
[58] Field of Search .......................... 371/16.1; 395/575; 364/579, 580, 267.4

[56] References Cited

U.S. PATENT DOCUMENTS

| | | | |
|---|---|---|---|
| 4,606,024 | 8/1986 | Glass et al. | 371/16 |
| 4,995,038 | 2/1991 | Brown | 371/16.1 |
| 5,005,173 | 4/1991 | Martin | 371/22.6 |
| 5,103,167 | 4/1992 | Okano et al. | 324/158 |
| 5,123,017 | 6/1992 | Simpkins et al. | 371/15.1 |
| 5,130,988 | 7/1992 | Wilcox et al. | 371/22.3 |
| 5,132,635 | 7/1992 | Kennedy | 324/158 R |
| 5,138,619 | 8/1992 | Fasang et al. | 371/21.1 |
| 5,157,781 | 10/1992 | Harwood et al. | 395/575 |
| 5,198,759 | 3/1993 | Ohnesorge | 324/158 |
| 5,325,368 | 6/1994 | James et al. | 371/22.3 |
| 5,329,471 | 7/1994 | Swoboda et al. | 364/578 |
| 5,343,478 | 8/1994 | James et al. | 371/22.3 |
| 5,428,624 | 6/1995 | Blair et al. | 371/22.3 |
| 5,434,804 | 7/1995 | Bock et al. | 364/579 |

OTHER PUBLICATIONS

McHugh, IEEE P1149.5 "Module Test & Maint Bus", vol. 9, Issue 4, pp. 62–65 Dec. 1990.
Tulloss, IEEE 1149 Standards–Changing Testing, Silicn to Systems, Int. Test Conf. pp. 399–408 Oct. 1993.
Poirier, IEEE P1149.5 to 1149.1 Data & Protocol Conversion, Int. Test Conf. pp. 527–535 Oct. 1993.

*Primary Examiner*—Robert W. Beausoliel, Jr.
*Assistant Examiner*—Stephen C. Elmore
*Attorney, Agent, or Firm*—Burns, Doane, Swecker & Mathis, L.L.P.

[57] ABSTRACT

A testing device has an architecture including a board test interface for coupling to test points on a circuit board; a programmable processor, coupled to the board test interface, for controlling a test of the circuit board via the board test interface; and a first communications interface, coupled to the programmable processor, for coupling to a like first communications interface located on another testing device. The programmable processor uses the first communications interface for communicating test commands and test results with the other testing device, so that a complete test of a system can be produced. The testing device may further include a control port, coupled to the programmable processor, for communicating system test commands between a host processor and the programmable processor. In response to a first system test command received from the host processor via the control port, the programmable processor may use the first communications interface to send a second test command to another testing device. Also, a number of identical testing devices, each located on a corresponding one of a number of circuit boards in a system, may use the first communications interface to transmit test results to one of the testing devices, designated as a master coordinating device. The master coordinating device then forwards all of the test results to a host processor for analysis. The entire testing device may be fabricated as a single integrated circuit, in order to provide great testability without occupying a great deal of circuit board space.

26 Claims, 3 Drawing Sheets

DIGITAL TEST AND MAINTENANCE ARCHITECTURE

This invention was made with Government support under contract No. DAAJ09-91-C-A004 awarded by the Department of Defense. The Government has certain rights in this invention.

BACKGROUND

The present invention relates to the testing of modern electronics systems, and more particularly to a hardware architecture for use in testing a complicated modern electronics system, and even more particularly to an integrated circuit testing device for use in testing a complicated modern electronics system.

An important part of the operation of many electronics systems is the ability to detect when it is not operating properly. In addition to detecting the presence of faults, it is an additional requirement in many systems that the ability to determine the location of the fault be provided, in order to facilitate repairs to the system.

An earlier method of detecting faults in an electronics system was to build redundant circuits into the hardware. When such a system is working properly, the outputs of the redundant circuits will match one another. A mismatch in the outputs of such identical circuits indicates that at least one of them is not working properly. In some systems, where it was also necessary to determine which of the redundant circuits was malfunctioning, three or more such redundant circuits were provided. Then, any one circuit whose output differed from the remaining redundant circuits was easily identified as the malfunctioning circuit.

Another approach to fault isolation and detection is to build into the system special hardware which, during a "test mode of operation," applies sequences of stored signals to what are normally the input nodes of the circuit under test (CUT), and then compares the actual outputs of the CUT with pre-stored, expected responses. By carefully selecting a sequence of test input signals, it is often possible not only to detect the presence of a fault, but also to determine the location of the faulty circuit element.

The above-described built-in test (BIT) "functional" approaches to fault detection and isolation have a number of drawbacks, including the great deal of time that is necessary to develop the tests, as well as the need to dedicate much hardware to support these and other "ad hoc" test methods. Also, as the number of circuits on integrated circuits ("chips"), circuit boards and total systems gets larger and larger, the ability of the "functional" test approach to locate circuit faults decreases because this increase in circuit density has not been matched by a comparable increase in input and output (I/O) pins to the respective chip, board or system. Consequently, it may not be possible to produce a pattern of input signals which will determine, with any certainty, which one of a number of circuits is failing.

An alternative, and more robust solution to the problem of testing electronic systems is the so-called "structured" BIT approach. In this test approach, known input signals are applied, and output signals are monitored not only at the I/O interface of a circuit, but also at particular nodes within the circuit which are not normally accessible to non-circuit elements during normal operation of the system. As a minimum, this approach to testing the primary circuits of a system requires the addition of special test circuits in order to provide access to the internal nodes of the primary circuits. In addition, it is common to include within the system dedicated hardware whose function is to perform the tests. The test itself may comprise the application of specially devised signal patterns and/or random signal patterns at the control points in order to propagate potential faults to the built-in observation points. The signal patterns detected at these observation points may be compressed, using known data compression techniques, and then compared to stored, expected responses.

Even with the use of "structured" BIT hardware, modern complex systems pose testability problems. This stems from the fact that a complex system very often comprises a number of physically separate circuit boards which are interconnected by means of a common backplane to form a chassis. In addition, it is possible for a system to comprise more than one chassis, thus creating the need for inter-chassis test operations and coordination.

Testing requirements for such systems typically may include the detection of at least 95% of all faults, as well as the ability to isolate at least 90% of all detectable faults to a single circuit card, which can then be replaced by a technician having minimal training. To achieve these testability requirements, BIT systems typically require dedicated communication paths which allow the test hardware to communicate even when the primary system communication paths are faulty. Several test busses have been standardized in the past few years in order to serve this purpose.

One of these is the IEEE Standard 1149.1 test bus, which provides a simple, serial data and instruction transfer bus. It is a single-ended, 4-wire bus for transferring a clock, data in, data out, and control signals. With this bus, devices are interconnected in a serial, daisy-chain fashion, so that data is clocked into and out of each connected device in succession, in a process that is referred to as "scanning" of data. Many off-the-shelf parts now contain an interface to the IEEE Standard 1149.1 bus.

Another standard test bus is the proposed IEEE Standard 1149.5 test bus. This bus is defined as four single-ended wires: two data lines (like the IEEE Standard 1149.1 bus described above), and two bi-directional control lines which allow multi-master capability. This bus allows a number of interfaces to be tied together on the same four wires in a party-line fashion, so that there can be one sender and multiple simultaneous listeners.

Several testing approaches have been used in the kind of multi-board, multi-chassis systems described above. One of these approaches is to use a testing processor, located on one of the circuit boards, to perform all of the testing for the chassis. Using only the one testing processor for testing all of the circuit boards makes it possible to generate circuit failure information of the type which can be culled only from an analysis of which boards are failing and which ones are not. This technique requires that a test bus, such as the IEEE Standard 1149.1 test bus described above, be routed not only to the BIT logic located on the same board as the testing processor, but also through the backplane so that the BIT logic located on other boards can be controlled.

The method of using a single processor to entirely control chassis testing has the drawback, however, that if a circuit board from the chassis is to be removed and then reinstalled in the backplane of another chassis, it does not take with it any of the original testing processor's control logic for testing its own circuits. Instead, this must be at least reproduced, and probably redesigned (depending on the logic involved), in the testing processor of the new chassis. Another drawback is the fact that a historical record of faults that have occurred on the board in the original chassis (i.e., a "fault log") does not travel with the circuit board, but instead stays with the processor still located on the original chassis. Consequently, this important information is essentially lost when the board is removed from its original environment. Finally, yet another drawback of this test approach is that it should not be used in a multi-chassis environment. This is because a test bus such as the IEEE Standard 1149.1 test bus should not cross from one backplane to another because it is a single ended logic signal (high quality interface standards recommend the use of only differential signals between backplanes).

An alternative testing approach is to equip each circuit board with a testing processor and a "private" test bus, such as an IEEE Standard 1149.1 test bus. With this arrangement, each circuit board is responsible for its own testing. An advantage of this is that the board's test capability moves with the board if it is to be reinstalled in a different chassis. Another advantage is that the circuit board's fault log also travels with the board, so the new chassis gets the benefit of testing which was performed on the board in the original chassis. However, because each board's testing processor operates independently of other testing processors, it is not possible, with this approach, to get the benefit of correlating test results from all of the boards in the system.

SUMMARY

It is therefore an object of the present invention to provide a testing architecture which permits the test logic and fault log associated with each of a number of circuit boards to be located on that respective circuit board.

It is another object of the present invention to provide a testing architecture which permits test results from different circuit boards to be collected and analyzed by one processor.

It is yet another object of the present invention to provide a testing architecture in which the test operations on each board may be coordinated by one host processor.

It is still another object of the present invention to provide a testing architecture having the above characteristics and which will fit on a single integrated circuit.

In accordance with one aspect of the present invention, the foregoing and other objects are achieved in a testing device comprising board test interface means for coupling to test points on a circuit board; programmable processing means, coupled to the board test interface means, for controlling a test of the circuit board by means of the board test interface means; and first communications interface means, coupled to the programmable processing means, for coupling to a like first communications interface means located on another testing device. This architecture permits the programmable processing means to use the first communications interface means for exchanging test commands and test results with one or more other testing devices. When each testing device resides on a separate circuit board, a complete test of the system can be facilitated by having each testing device control the test and maintenance operations associated with the hardware located on the same board as the testing device, and then by using the first communications interface means to transmit the resulting test data to a central location for analysis.

In another aspect of the invention, each testing device further comprises a control port, coupled to the programmable processing means, for exchanging system test commands between a host processor and the programmable processing means. This feature permits a host processor, which may for example be one that is embedded within the system to be tested, to send test commands to one testing device which is then designated the master testing device. The master testing device can respond to the test commands not only by performing the requested test on the hardware located on the same board as the master testing device, but also by using the first communications interface means to forward a test command to other testing devices located on other circuit boards in the system.

A system may include one or more backplanes, so each testing device may have a communications interface means that is capable of coupling to a bus which will cross backplane boundaries. Each testing device may also be equipped with two different communications interface means, one adapted for communication on a bus which traverses only a single backplane, the other communications interface means adapted for communication on a bus which traverses one or more backplanes.

After each testing device has completed the test and maintenance operations associated with hardware located on the same circuit board as the testing device, the first communications interface means can be used to send all of the test results back to the master testing device. The master testing device can then use the control port to send these accumulated test results back to the host processor for analysis.

Another aspect of the present invention is the fact that the elements which comprise the entire test and maintenance architecture associated with each testing device will all fit on a single integrated circuit. This provides a particular advantage over the prior art because it allows system designers to easily meet even very stringent system test requirements simply by designing their systems to include one of the inventive testing devices on each board in the system.

Still further aspects of the present invention include the provision of a clock buffering system and a buffered reset signal within the testing device.

BRIEF DESCRIPTION OF THE DRAWINGS

The objects and advantages of the invention will be understood by reading the following detailed description in conjunction with the drawings in which.

DETAILED DESCRIPTION

Figure 1:
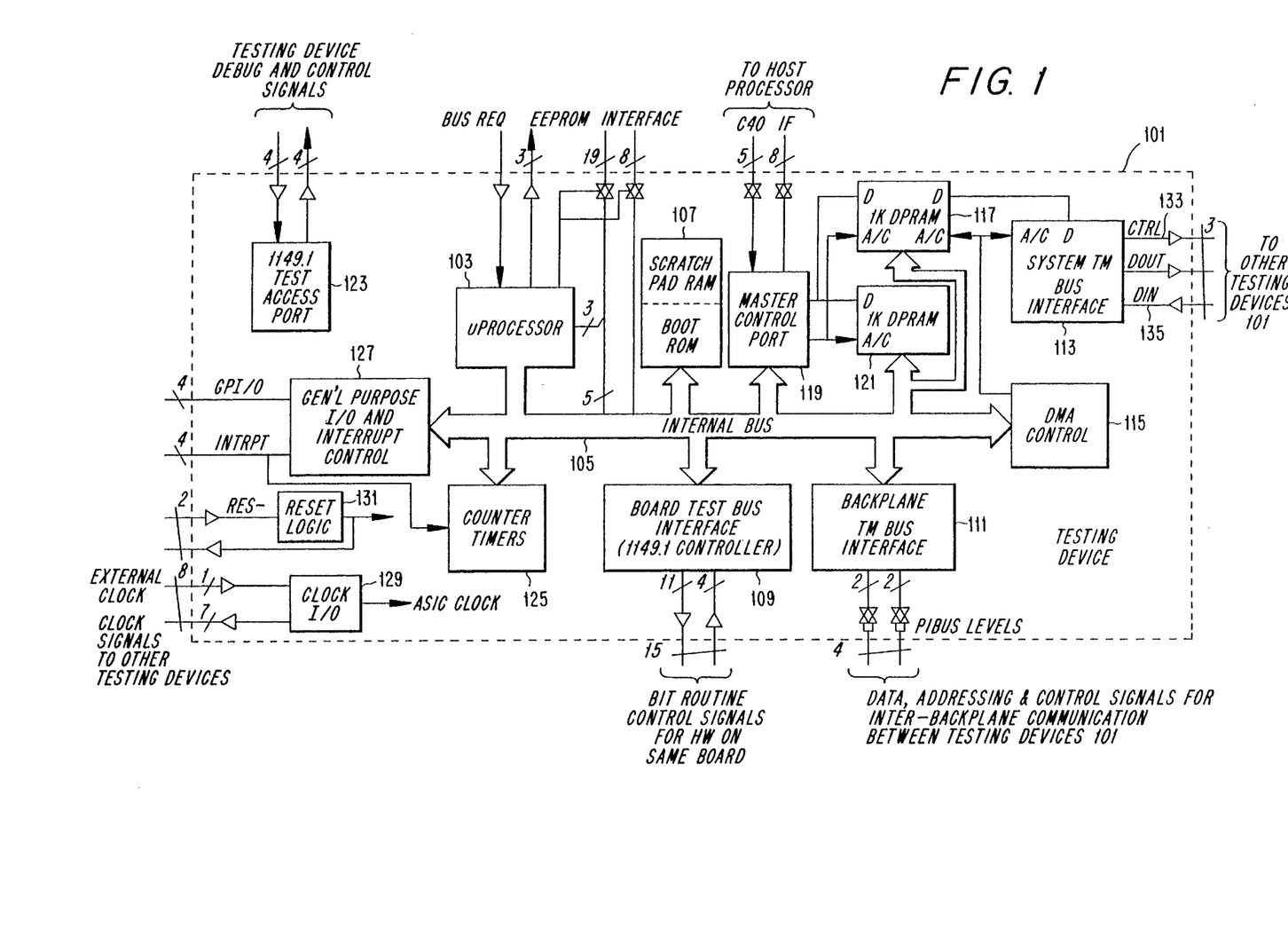
FIG. 1 is a block diagram of a testing device in accordance with one embodiment of the present invention.

FIG. 1 is a block diagram of a testing device 101 that encompasses the Digital Test and Maintenance Architecture (DTMA) of the present invention. The DTMA is configured to provide great versatility when it is embedded in a system to be tested. The following list of capabilities is exemplary, and is by no means meant to be exhaustive:

1. Transferring of stimulus and response vectors through the IEEE Standard 1149.1 test bus interfaces.

2. Providing discrete stimulus signals for inputs of the circuit under test, and observing outputs of the circuit under test.

3. Filtering test results data, and making decisions as to whether or not a fault exists in the system.

4. Coordinating on-card tests, the tests of circuits on nearby cards not having a dedicated DTMA, and the tests being performed by a plurality of DTMA's within the system.

5. Performing tasks requiring timing, counting and synchronization with the outside world and external events.

6. Tracking of current time at any point in the operation, using the real-time clock.

7. Determining the total time of operation that a card has been operating.

8. Maintaining a history of detected faults in a fault log.

9. Maintaining configuration control data such as part numbers, revision numbers, identification of manufacturer, and the like.

In addition to having great versatility, the components of the DTMA have been selected to permit the entire architecture to be fabricated as a single integrated circuit. Consequently, it is possible to include the testing device 101 on every circuit board in a system without giving up a great deal of circuit board space. In fact, a DTMA, an electrically erasable programmable read only memory (EEPROM) and a differential transceiver together can occupy as little as 2.16 square inches of circuit board space.

The heart of the testing device 101 is the microprocessor 103, which in the preferred embodiment is an 8-bit Zilog Z-80 microprocessor, running at a clock speed up to 10 MHz. The microprocessor 103 includes a port for coupling to an off-chip EEPROM (not shown), which may hold up to 512K×8 bits. The EEPROM stores a program for controlling the operation of the microprocessor 103, and may also store a fault log.

The microprocessor 103 is coupled to the other elements of the testing device 101 by means of an internal bus 105, which is preferably an 8-bit tri-state bus. The other elements, under the direction of the microprocessor 103, control the execution of circuit board built-in test (BIT) routines for testing hardware located on the same circuit board as the testing device 101 and also permit the microprocessor 103 to communicate with other testing devices 103 located on other circuit boards for the purpose of coordinating tests and sharing test results. These and other features will be described in greater detail below.

A local storage unit 107, comprising small blocks of random access memory (RAM) and read only memory (ROM), is coupled to the internal bus 105 in order to provide the microprocessor 103 with the ability to boot up (from a bootstrap program stored in the ROM-part of local storage unit 107), and to access and modify variable data (stored in the RAM part of local storage unit 107). The number of memory locations in the local storage unit 107 is relatively small. In the preferred embodiment, the local storage unit 107 has from 6K to 8K bytes of individually addressable RAM locations, and 128 individually addressable ROM locations. Of course, future applications may require even more storage.

As mentioned above, the microprocessor 103 is able to directly control the execution of BIT routines for testing hardware components which are located on the same circuit board as the testing device 101. This is accomplished by means of the board test bus interface 109, which is coupled to the internal bus 105. In a preferred embodiment, the board test bus interface 109 is an IEEE Standard 1149.1 controller. As described above, the IEEE Standard 1149.1 test bus is a 4-wire bus comprising a clock, data in, data out, and control wires. The IEEE Standard 1149.1 test bus and controllers for this test bus are well known to those having ordinary skill in the art, and are not described here in detail.

Using the board test bus interface 109, the microprocessor can serially transfer data to and from any device on the board, provided that the device has a compatible test access port. This ability permits the microprocessor 103 to carry out hardware tests whereby stimulus signals are established at particular nodes of the surrounding circuitry, and response signals are routed from output nodes back to the testing device 101. The microprocessor 103 can compare these resulting signals with expected signals in order to detect the presence of faults and to determine the location of these faults. The control program for the microprocessor 103 is preferably organized so that fault filtering steps, that is, the repetition of tests to verify the existence of bad results, are performed before passing the test results on to higher levels of the BIT decision processes, which, as explained below, may be located in different testing devices 101.

As explained above, it is often desirable to correlate the results of tests performed on separate circuit boards in order to detect and isolate system-related errors. This feature is made available, in accordance with the present invention, by providing each testing device 101 with means for communicating with other testing devices 101, which may be located on other circuit boards on the same or on a different backplane. This will now be described in greater detail.

Coupled to the internal bus 105 is a backplane test and maintenance (TM) bus interface 111. As the name implies, the backplane TM bus interface 111 allows the testing device 101 to send and receive data on a TM bus (not shown) which traverses a single backplane in the system to be tested. The microprocessor 103 provides the high-level control functions for the backplane TM bus interface 111, in order to transfer data between the backplane TM bus interface 111 and the local storage unit 107 or either of the first and second dual port RAM's (DPRAM's). Data is transferred between these units for the purpose of test correlation and coordination.

A testing device 101 that is coupled to the backplane TM bus may communicate with any other testing device 101 that is also coupled to that same bus. To facilitate this communication, the backplane TM bus preferably provides discrete addressing (i.e., the ability to send a message to a specific backplane TM bus node), broadcast addressing (i.e., the ability to send a message to all or a subset of the backplane TM bus nodes), the ability for a slave device to communicate an interrupt request to a master device, interrupt priority resolution, the ability for any node to become a master of the bus ("multi-master" capability) and fault tolerance capabilities (i.e., the ability of the backplane TM bus to continue operating despite the existence of one or more faulty nodes on the bus). When one testing device 101 receives a communication from another testing device coupled to the same backplane TM bus, each data transfer includes a message header which may contain an address of the intended recipient of the message, as well as commands to be interpreted by the microprocessor. These commands should be standardized, such as those defined by the proposed IEEE Standard 1149.5. This communication not only permits the testing devices 101 to share the results of different circuit board tests, but it also permits the testing devices 101 to be organized so that one testing device 101, designated a "master testing device," can initiate and coordinate the testing operations that are performed on all of the boards connected to a single backplane.

In a preferred embodiment of the present invention, the backplane TM bus is constructed in accordance with the proposed IEEE Standard 1149.5, so that it is a single ended, 4-wire serial data bus which provides multiple addressing modes and interrupt capabilities. Each of the four wires of the backplane TM bus has a particular function: one data in line, one data out line, and two bi-directional control lines which allow multi-master capability. This arrangement permits a number of interfaces to be tied together on the same four wires in a party-line fashion. This type of bus also has the advantage of permitting data to be transferred between nodes at the primary clock rate. The design and operation of a data bus in accordance with proposed IEEE Standard 1149.5 is well-known in the art, and is not described here in further detail.

The testing device 101 also preferably includes a system TM bus interface 113, which is an additional interface for permitting communication with other testing devices 101. The system TM bus interface 113 may be designed to encode data with the use of frequency modulation (FM) in order to drive that data onto the data transfer medium, with a digital phase locked loop being used to synchronize the modulation process to the input data stream. Although differential drive and receive capability is preferably provided on the same chip as the testing device 101, a single, external RS-485 device may be required for this interface.

A discrete enable pin 133 ("CTRL"), connected to the system TM bus interface 113, allows each testing device 101 to drive its data onto the data transfer medium while the system TM bus interface 113 monitors the data, via the data in line 135 ("DIN") to check for interference. As data is transferred out testing device 101, it is encoded with clocking information, so that clocks need not be synchronized between nodes.

The receipt of data over the system TM bus interface 101 is facilitated by the use of a direct memory access (DMA) controller 115, for controlling byte-level synchronization of transfers between the system TM bus and a first dual port RAM (DPRAM) 117. The microprocessor 103 is thereby relieved of this work.

Data transfers on the system TM bus are preferably coordinated by the use of a network management protocol, such as a synchronous data link control (SDLC) protocol. Alternatively, a token-passing protocol, such as the one defined by ANSI/IEEE Standard 802.4, may be selected. ANSI/IEEE Standard 802.4 specifies a network protocol that allows multiple nodes to coordinate the transfer of data over a single data transfer medium, such as wire. In accordance with this protocol, a symbolic network control token is continuously passed from one node to another. Possession of the token by a node gives that node the right to control the network for a small increment of time. Thus, the ANSI/IEEE Standard 802.4 protocol provides more sophistication at the expense of being more complicated to implement. Consequently, one should only consider using the ANSI/IEEE Standard 802.4 protocol if it is anticipated that three or more nodes will be connected. Otherwise, the SDLC protocol is probably the best alternative. Data transfer protocols, such as the SDLC and ANSI/IEEE Standard 802.4 protocols, are well known to those of ordinary skill in the art of data communication network design, and are not described here in detail.

Having a system TM bus interface 113 in addition to the backplane TM bus interface 111 is advantageous for several reasons. First, the backplane TM bus is a fast bus whose many features, such as interrupt and addressing capability, make it very versatile. However, it is not designed to connect one backplane to another. In contrast, the slower and less versatile system TM bus is capable of interconnecting testing devices 101 which reside on circuit boards which may be plugged in to separate backplanes. Thus, the system TM bus is available for providing even greater interconnectivity between testing devices 101 in a system comprising more than one backplane.

Furthermore, the system TM bus serves as a backup means of communication between testing devices 101 connected to a single backplane, in the event of a failure of the backplane TM bus.

Another feature of the testing device 101 is a master control port 119. This is preferably a high speed, 8-bit parallel interface for communicating with a host processor. Through this port, high-level test and maintenance commands may be exchanged with the primary system hardware.

The hardware within the master control port 119 handles all byte transfers and insures that the microprocessor 103 is interrupted only after an entire message has been received.

Figure 3:
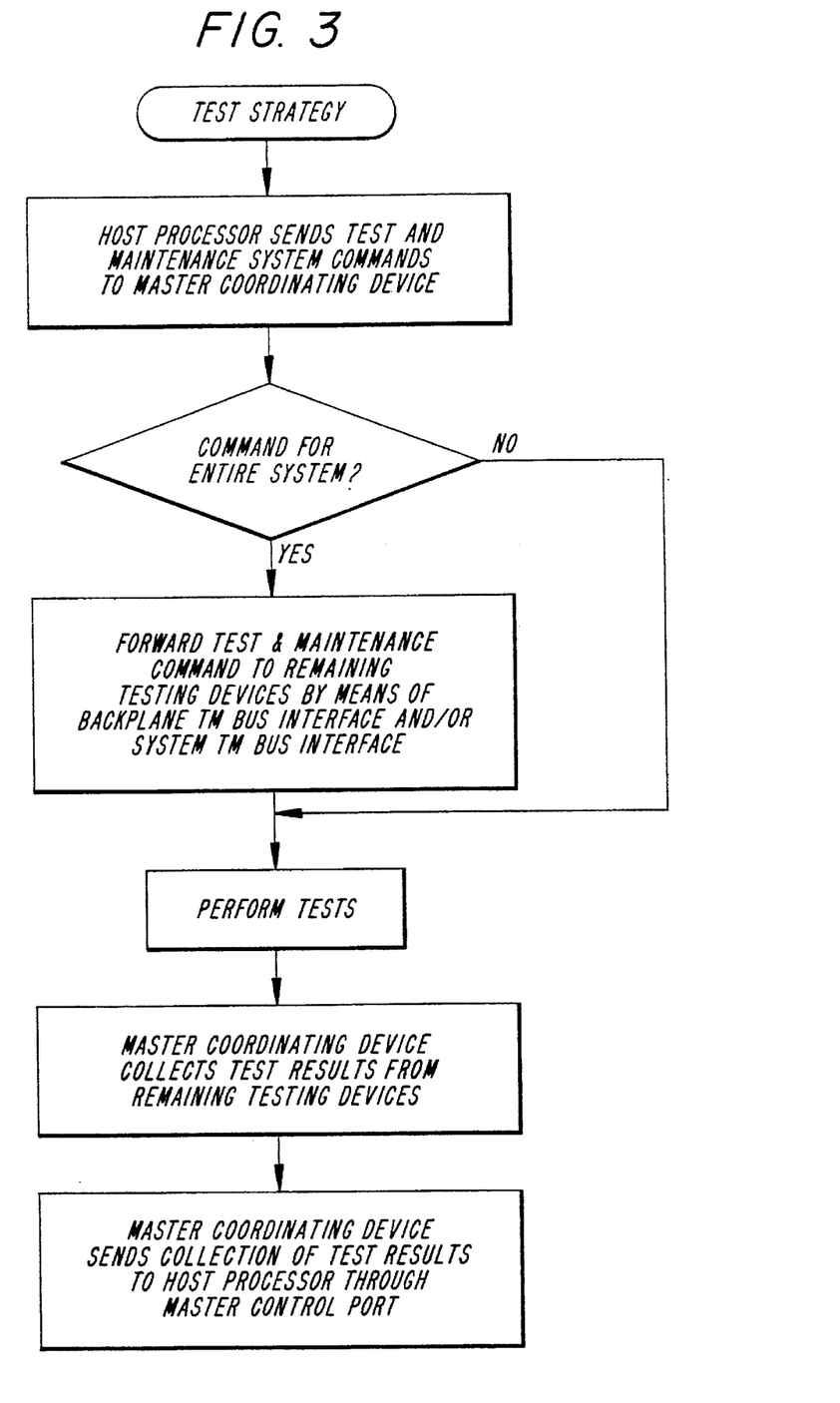
FIG. 3 is a high-level flow diagram of the sequence of operations that may take place in accordance with an illustrative embodiment of the invention.

Typically, only one or two nodes in a system of testing devices 101 use the master control port 119. This is because the nodes which utilize this host interface serve as gateways to the rest of the system. Such nodes are referred to as "master coordinating devices." In operation (see FIG. 3), test and maintenance system commands are communicated from a host processor (not shown) to a master coordinating device 101 by means of the master control port 119. The microprocessor 103 within the master coordinating device 101 then determines whether the message is intended for the entire system. If so, the microprocessor 103 forwards the message to the remaining testing devices 101 by means of the backplane TM bus interface 111, the system TM bus interface 113, or both.

After the requested tests have been performed, data from individual testing devices 101 in the system may be collected by the master coordinating device 101, and returned to the host processor by reversing the direction of data transfer of the master control port 119.

In a preferred embodiment of the present invention, a second DPRAM 121 is provided for coupling the system TM bus interface 113 to the master control port 119, thus saving the microprocessor 103 from the task of having to move messages between the host processor and other testing devices 101.

In addition to the features described above, a preferred embodiment of the testing device 101 also includes several other supporting features. One of these is a test access port 123, which is preferably an IEEE Standard 1149.1 test access port. As stated above, the testing device 101 is preferably fabricated as an integrated circuit. Consequently, the test access port 123 is very important not only for initially performing engineering debug of the testing device 101, but also for subsequent control after it has been installed in a system. For this purpose, the test access port 123 should be routed to an edge connector of the card on which the testing device 101 resides. In a preferred embodiment of the present invention, the testing device 101 also contains hardware logic (not shown) to support the exchange, through the test access port 123, of data with external test equipment. This hardware logic preferably also supports single-step operation, halt, and break points in the testing device 101.

Counter/timers 125 may be included in the testing device 101 for use in internally synchronizing events for the microprocessor 103. Synchronization with external events related to peripheral circuits may be handled by also including a general purpose I/O (GP I/O) and interrupt controller 127 within the testing device 101. The GP I/O and interrupt controller 127 includes discrete I/O pins so that the testing device 101 can control any discrete elements in the design of the system. For example, the testing device 101, by means of the GP I/O and interrupt controller 127, can generate its own signal for resetting board on which it resides, without requiring such a signal to be generated by an external source. The generated reset signal can be transmitted to the board elements via the discrete I/O pins of the GP I/O and interrupt controller 127.

A clock buffering system 129 should be included within the testing device 101 for supporting other testing devices 101 within the same chassis. A preferred arrangement is to have the clock buffering system 129 of a first testing device 101 receive a clock signal from a source external to the testing device 101. The first testing device 101 then not only uses the received clock signal for its own uses, including the clocking of all elements within the testing device 101 and synchronizing signals appearing on either of the board test bus interface 109 and the backplane TM bus interface 111, but also uses an output of the clock buffering system 129 to broadcast the clock signal to all of the remaining testing devices 101.

A buffered reset signal means 131 should also be provided for distribution within the chassis. The preferred arrangement is similar to that of the clock buffering system 129 described above. That is, an externally generated reset signal (such as a "power on reset" signal) is received by a first testing device 101. The buffered reset signal means 131 distributes this signal within the testing device 101 in order to perform all necessary initialization. An output of the first testing device's buffered reset signal means 131 may then be used for distribution not only to all remaining testing devices 101, but also to any other elements in the system (including distribution by means of the board test bus interface 109 and the backplane TM bus interface 111) which would require the receipt of such a signal to instigate initialization.

Figure 2:
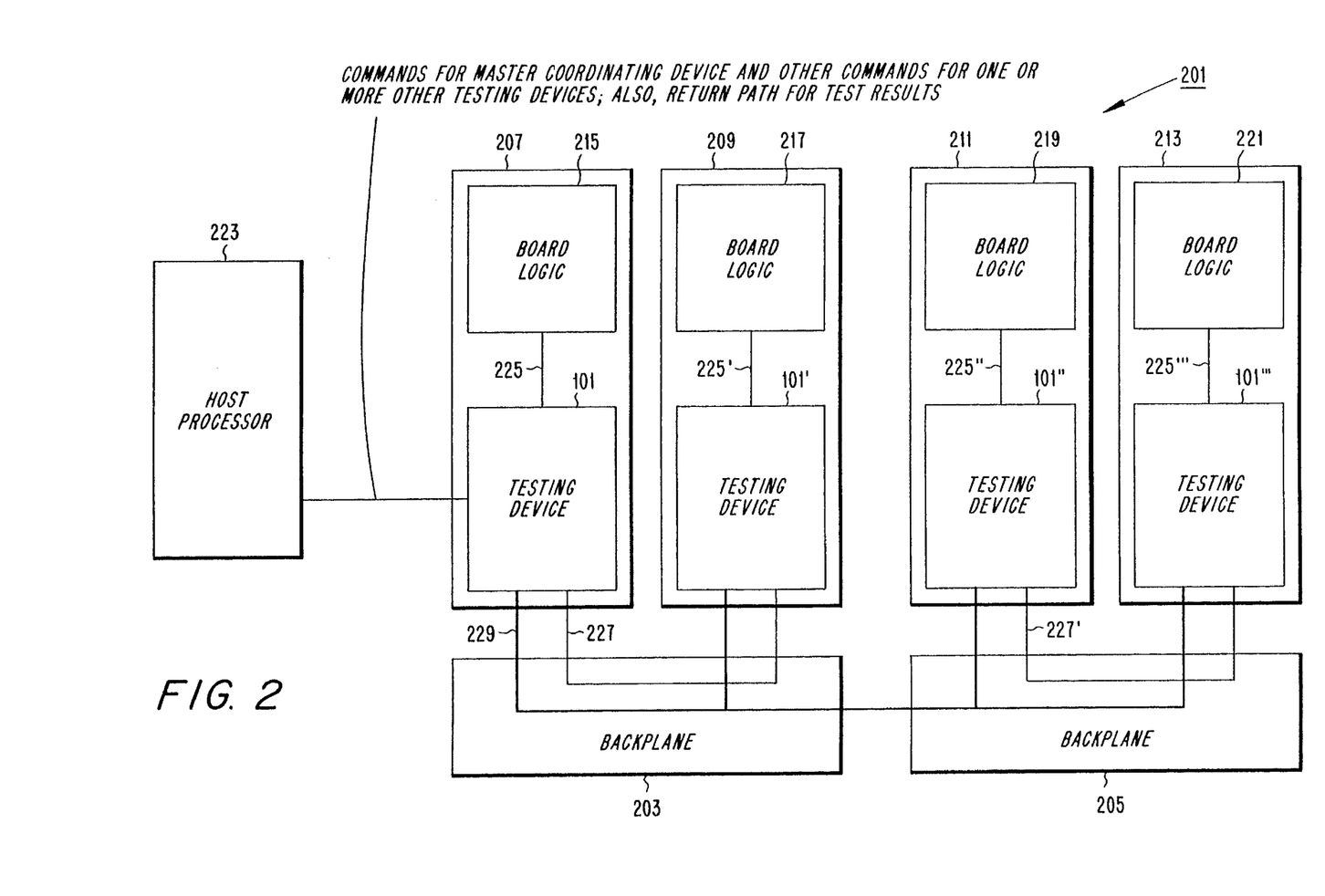
FIG. 2 is a block diagram of an exemplary two backplane system, each having several circuit boards which each include a testing device in accordance with the present invention.

Referring now to FIG. 2, an exemplary system 201 is shown which utilizes a number of testing devices 101 in accordance with the present invention. The system 201 comprises a first backplane 203 and a second backplane 205. First and second circuit boards 207 and 209 are coupled to the first backplane 203, and third and fourth circuit boards 211 and 213 are coupled to the second backplane 205. Each of the circuit boards 207, 209, 211 and 213 includes corresponding board logic 215, 217, 219 and 221 which, in practice, would be designed to carry out the intended functions of the system.

In accordance with the present invention, each of the circuit boards 207, 209, 211 and 213 has also been designed to include a testing device 101, 101', 101" and 101'". The board logic 215, 217, 219 and 221 of each circuit board 207, 209, 211 and 213 is coupled to the respective testing device 101, . . . 101'" located on that board by means of a board test bus 225, 225', 225", 225'" (such as an IEEE Standard 1149.1 test bus) which is connected to the board test bus interface (not shown) of the testing device 101, . . . 101'". It is via this path that each of the testing devices 101, . . . , 101'" is able to perform test and maintenance functions related to its corresponding board logic 215, 217, 219 and 221.

Testing of the system 201 is under the control of a host processor 223. The host processor 223 is depicted as being separate from the two backplanes 203, 205. However, the system may be designed to incorporate the host processor 223 on a circuit board that is connected to one of the backplanes 203, 205. The host processor 223 is coupled to the testing device 101 located on the first circuit board 207 by means of the master control port (not shown) located on the testing device 101. Because of its coupling to the host processor, the testing device 101 is called the master coordinating device 101.

The master coordinating device 101 is coupled, by means of a backplane TM bus 227, to the other testing device 101', which is also located on the first backplane 203. The master coordinating device 101 is also coupled, by means of its system TM bus 229, to each of the other testing devices 101', 101", 101'", which may be located on either of the backplanes 203, 205 in the system 201.

In response to commands from the host processor 223, the master coordinating device 101 may control testing of the board logic 215. These commands may also instruct the master coordinating device 101 to pass test commands to one or more of the other testing devices 101', 101", 101'", so that each may control the testing of its corresponding board logic 217, 219, 221. After all tests have been performed, each testing device 101', 101", 101'" may send the test results back to the master coordinating device 101, which then forwards all of the test results back to the host processor 223. Analysis of the test results is then performed by the host processor 223.

The invention has been described with reference to a particular embodiment. However, it will be readily apparent to those skilled in the art that it is possible to embody the invention in specific forms other than those of the preferred embodiment described above. This may be done without departing from the spirit of the invention. For example, it is not necessary that the above-described types of test busses and communication protocols be used. Instead, a particular arrangement of backplanes or board logic may make other protocols more appropriate.

Accordingly, the preferred embodiment is merely illustrative and should not be considered restrictive in any way. The scope of the invention is given by the appended claims, rather than by the preceding description, and all variations and equivalents which fall within the range of the claims are intended to be embraced therein.

What is claimed:

1. A testing device comprising:

board test interface means for coupling to test points on a circuit board;

programmable processing means, coupled to the board test interface means, for controlling a test of the circuit board via the board test interface means;

first communications interface means, coupled to the programmable processing means, for multi-master coupling to a like first communications interface means located on another testing device, wherein the programmable processing means uses the first communications interface means for communicating test commands and test results with said another testing device, and wherein the testing device is fabricated as an integrated circuit.

2. The testing device of claim 1, further comprising a control port, coupled to the programmable processing means, for communicating test commands between a host processor and the programmable processing means.

3. The testing device of claim 2, wherein the programmable processing means receives a first system test command from the control port, and in response thereto, uses the first communications interface means to send a second test command to said another testing device.

4. The testing device of claim 2, wherein the programmable processing means receives from the first communications interface means test results produced by said another testing device, and in response thereto uses the control port to forward the test results to the host processor.

5. The testing device of claim 2, further comprising dual port memory means including a first memory port and a second memory port, the first memory port being coupled to the control port, and the second memory port being coupled to the first communications interface means.

6. The testing device of claim 5, further comprising a direct memory access controller, controlled by the programmable processing means and coupled to the dual port memory means and to the first communications interface means for facilitating a data transfer therebetween.

7. The testing device of claim 1, further comprising second communications interface means, coupled to the programmable processing means, for coupling to a like second communications interface means located on another testing device, wherein the programmable processing means uses the second communications interface means for communicating test commands and test results with said another testing device.

8. The testing device of claim 7, further comprising:

clock input means for receiving an externally generated clock signal;

synchronizing means, coupled to said clock input means, to said first communications interface means and to said second communications interface means, for controlling generation of signals appearing on said first communications interface means and on said second communications interface means;

clock redistribution means, coupled to said clock input means, for redistributing said received externally generated clock signal to said another testing device;

reset input means for receiving an externally generated reset signal; and reset redistribution means, coupled to said reset input means, for redistributing said received clock signal to said another testing device.

9. The testing device of claim 1, wherein:

the board test interface means is an IEEE standard 1149.1 controller; and the first communications interface means operates in accordance with ANSI/IEEE standard 802.4.

10. The testing device of claim 1, wherein:

the board test interface means is an IEEE standard 1149.1 controller; and the first communications interface means operates in accordance with a synchronous data link control protocol.

11. The testing device of claim 7, wherein:

the board test interface means is an IEEE standard 1149.1 controller;

the first communications interface means operates in accordance with ANSI/IEEE standard 802.4; and the second communications interface means is an IEEE standard 1149.5 interface.

12. The testing device of claim 7, wherein:

the board test interface means is an IEEE standard 1149.1 controller;

the first communications interface means operates in accordance with a synchronous data link control protocol; and the second communications interface means is an IEEE standard 1149.5 interface.

13. A testing system, comprising:

first and second testing devices, each comprising:

board test interface means for coupling to test points on a circuit board;

programmable processing means, coupled to the board test interface means, for controlling a test of the circuit board via the board test interface means; and first communications interface means, coupled to the programmable processing means, for multi-master coupling to a like first communications interface means located on another testing device, wherein the programmable processing means uses the first communications interface means for communicating test commands and test results with said another testing device, and wherein the first communications interface means of the first testing device is coupled to the first communications interface means of the second testing device;

wherein the first testing device is fabricated as a first integrated circuit, and the second testing device is fabricated as a second integrated circuit.

14. The testing system of claim 13, wherein each of said first and second testing devices further comprises a control port, coupled to the programmable processing means, for communicating system test commands between a host processor and the programmable processing means.

15. The testing system of claim 14, wherein the programmable processing means of the first testing device receives a first system test command from the control port, and in response thereto, uses the first communications interface means to send a second test command to the second testing device.

16. The testing system of claim 14, wherein the programmable processing means of the first testing device receives from the first communications interface means test results produced by the second testing device, and in response thereto uses the control port to forward the test results to the host processor.

17. The testing system of claim 14, wherein each of the first and second testing devices further comprises dual port memory means including a first memory port and a second memory port, the first memory port being coupled to the control port, and the second memory port being coupled to the first communications interface means.

18. The testing system of claim 17, wherein each of the first and second testing devices further comprises a direct memory access controller, controlled by the programmable processing means and coupled to the dual port memory means and to the first communications interface means for facilitating a data transfer therebetween.

19. The testing system of claim 17, wherein the first testing device is connected to a first circuit board, and wherein the second testing device is connected to a second circuit board.

20. The testing system of claim 19, wherein the first and second circuit boards are connected to a common backplane.

21. The testing system of claim 19, wherein the first circuit board is connected to a first backplane, and wherein the second circuit board is connected to a second backplane.

22. The testing system of claim 13, wherein each of the first and second testing devices further comprises second communications interface means, coupled to the programmable processing means, for coupling to a like second communications interface means located on another testing device, wherein the programmable processing means uses the second communications interface means for communicating test commands and test results with said another testing device, and wherein the second communications interface means of the first testing device is coupled to the second communications interface means of the second testing device.

23. The testing system of claim 22, wherein:

the board test interface means is an IEEE standard 1149.1 controller;

the first communications interface means operates in accordance with ANSI/IEEE standard 802.4; and the second communications interface means is an IEEE standard 1149.5 interface.

24. The testing system of claim 22, wherein:

the board test interface means is an IEEE standard 1149.1 controller;

the first communications interface means operates in accordance with a synchronous data link control protocol; and the second communications interface means is an IEEE standard 1149.5 interface.

25. The testing system of claim 13, wherein:

the board test interface means is an IEEE standard 1149.1 controller; and the first communications interface means operates in accordance with ANSI/IEEE standard 802.4.

26. The testing system of claim 13, wherein:

the board test interface means is an IEEE standard 1149.1 controller; and the first communications interface means operates in accordance with a synchronous data link control protocol.

\* \* \* \* \*